United States Patent
Tamagawa

Patent Number: 6,046,491
Date of Patent: *Apr. 4, 2000

[54] SEMICONDUCTOR RESISTOR ELEMENT HAVING IMPROVED RESISTANCE TOLERANCE AND SEMICONDUCTOR DEVICE THEREFOR

[75] Inventor: Akio Tamagawa, Tokyo, Japan

[73] Assignee: NEC Corporation, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/802,314

[22] Filed: Feb. 18, 1997

[30] Foreign Application Priority Data

Feb. 19, 1996 [JP] Japan .................................. 8-030265

[51] Int. Cl.[7] .................................................. H01L 29/00
[52] U.S. Cl. ........................................... 257/538; 257/536
[58] Field of Search ..................................... 257/536, 538

[56] References Cited

FOREIGN PATENT DOCUMENTS

| | | | |
|---|---|---|---|
| 55-83257 | 6/1980 | Japan | 257/538 |
| 55-123157 | 9/1980 | Japan | 257/536 |
| 55-125645 | 9/1980 | Japan | 257/538 |
| 58-10851 | 1/1983 | Japan | 257/536 |
| 63-52468 | 3/1988 | Japan | 257/538 |
| 228269 | 6/1990 | Japan | 257/536 |

*Primary Examiner*—Steven H. Loke
*Attorney, Agent, or Firm*—Hayes, Soloway, Hennessey, Grossman & Hage, P.C.

[57] ABSTRACT

A semiconductor resistor element that is able to remove the effect of an electric potential change of a wiring conductor is provided. This element includes a first semiconductor resistor region formed in a surface area of a substructure, a second semiconductor resistor region electrically connected to a first end of the first resistor region, a third semiconductor resistor region electrically connected to a second end of the first resistor region. The first resistor region has a first doping concentration. The second resistor region has a second doping concentration higher than the first doping concentration. The third resistor region has a third doping concentration equal to the second doping concentration. The second and third resistor regions serve as a pair of terminals of the semiconductor resistor element. The second and third resistor regions may be contacted with or apart from the respective ends of the first resistor region. In the latter case, the second and third resistor regions are electrically connected to the ends of the first resistor region through interconnection conductors, respectively.

8 Claims, 7 Drawing Sheets

SEMICONDUCTOR RESISTOR ELEMENT HAVING IMPROVED RESISTANCE TOLERANCE AND SEMICONDUCTOR DEVICE THEREFOR

BACKGROUND OF THE INVENTION

1. Field of the Invention

The present invention relates to a semiconductor resistor element and a semiconductor device and more particularly, to a semiconductor resistor element that is able to improve the resistance accuracy, and a semiconductor device using the resistor element, which is preferably applied to an R-2R ladder circuit.

2. Description of the Prior Art

An R-2R ladder circuit has been well known as an essential component of a Digital-to-Analog Converter (DAC) and an Analog-to-Digital Converter (ADC). When the R-2R ladder circuit is realized on a semiconductor device, a plurality of resistor elements are formed on or over a semiconductor substrate and they are electrically interconnected to each other with a patterned conductive layer or layers (i.e., wiring layer or layers). This circuit needs to have a high resistance-ratio accuracy of the resistor elements.

FIG. 1 is a circuit diagram of a conventional 4-bit DAC including the P-2R ladder circuit. In FIG. 1, this DAC comprises four switches S1, S2, S3, ard S4, fourteen resistor elements R6, R7, R8, R9, R10, R11, R12, R13, R14, R15, R16, R17, R18, and R19, a negative power supply terminal 1 to which a negative supply voltage is applied, an operational amplifier 2, an output terminal 3 from which an output voltage $V_o$ is derived, and a constant current sink 4 for sinking a constant current $I_o$.

Each of the resistor elements R6, R7, R8, R9, R10, R11, R12, R13, R14, R15, R16, R17, R18, and R19 serves as a unit resistor.

The switch S1 is switched according to the first bit of a 4-bit input code. The switch S2 is switched according to the second bit of the input code. The switch S3 is switched according to the third bit of the input code. The switch S4 is switched according to the forth bit of the input code. Each of the switches S1, S2, S3, and S4 is electrically connected to the inverting input terminal of the operational amplifier 2 if the corresponding bit is 1, and to the ground if the corresponding bit is 0. In FIG. 1, the switches S1, S2, S3, and S4 are in the state corresponding to the input code [1011], respectively.

Each of the resistor elements R6, R7, R8, R10, R11, R12, R13, R14, R15, R16, R17, R18, and R19 has the same resistance R. These resistor elements R6, R7, R8, R10, R11, R12, R13, R14, R15, R16, R17, R18, and R19 constitute an R-2R ladder circuit 7. The resistor element R9 has a resistance Rr. The resistor element R9 is connected to the output terminal 3 and the inverting input terminal of the amplifier 2. The resistor R9 serves as a feedback resqistor of the amplifier 2. The non-inverting input terminal of the amplifier 2 is electrically connected to the ground.

The resistor elements R10 and R11 are connected in series, serving as a combined resistor element with a resistance 2R. The unconnected end of the resistor R10 is electrically connected to the ground directly. The unconnected end of the resistor R11 is electrically connected to the resistor R6.

The resistor elements R12 and R13 are connected in series, serving as a combined resistor element with a resistance 2R. The unconnected end of the resistor R12 is electrically connected to the inverting input terminal of the amplifier 2 or the ground through the switch S4. The unconnected end of the resistor R13 is electrically connected to the resistor R6.

The resistor elements R14 and R15 care connected in series, serving as a combined resistor element with a resistance 2R. The unconnected end of the resistor R14 is electrically connected to the inverting input terminal of the amplifier 2 or the ground through the switch S3. The unconnected end of the resistor R15 is electrically connected to the connection point of the resistors R6 and R7.

The resistor elements R16 and R17 are connected in series, serving as a combined resistor element with a resistance 2R. The unconnected end of the resistor R16 is electrically connected to the inverting input terminal of the amplifier 2 or the ground through the switch S2. The unconnected end of the resistor R17 is electrically connected to the connection point of the resistors R7 and R8.

The resistor elements R18 and R19 are connected in series, serving as a combined resistor element with a resistance 2R. The unconnected end of the resistor R18 is electrically connected to the inverting input terminal of the amplifier 2 or the ground through the switch S1. The unconnected end of the resistor Rig is electrically connected to the connection point of resistor element R8 and the constant current sink 4.

The combination of the resistor elements R12 and R13 and the corresponding resistor element R6 have a resistance ratio of 2:1. The combination of the resistor elements R14 and R15 and the corresponding resistor element R7 have a resistance ratio of 2:1. The combination of the resistor elements R16 and R17 and the corresponding resistor element R8 have a resistance ratio of 2:1. Thus, the circuits 7 is termed the "R-2R" ladder circuit.

With the conventional 4-bit DAC shown in FIG. 1, a current flowing through the switch S1 is equal to $(½) I_1$ when the first bit of the input code is 1, where $I_1$ is a current flowing through the resistor elements R10 and R11. A current flowing through the switch S2 is equal to $(¼)I_1$ when the second bit of the input code is 1. A current flowing through the switch S3 is equal to $(⅛)I_1$ when the third bit of the input code is 1. A current flowing through the switch S4 is equal to $(1/16)I_1$ when the fourth bit of the input code is 1.

Thus, according to the currents flowing through the switches S1, S2, S3, and S4 (in other words, according to the 4-bit digital input code), the output voltage $V_o$ varies stepwise at equal intervals within the range from 0 to [I•Rr• $(15/16)$]. Specifically, the output voltage $V_o$ is equal to 0, [I•Rr•$((1/16)$], [I•Rr•$(2/16)$], [I•Rr•$(3/16)$], [I•Rr•$(4/16)$], [I•Rr• $(5/16)$], [I•Rr•$(6/16)$], [I•Rr•$(7/16)$], [I•Rr•$(8/16)$], [I•Rr•$(9/16)$], [I•Rr•$(10/16)$], [I•Rr•$(11/16)$], [I•Rr•$(12/16)$ ], [I•Rr•$(13/16)$], [I•Rr• $(14/16)$], or [I•Rr•$(15/16)$].

To improve the accuracy of the resistance ratio of 2:1, i.e., to improved the digital-to-analog conversion accuracy, for example, the conventional R-2R ladder circuit of FIG. 1 is realized on a semiconductor device having the configuration as shown in FIGS. 2 and 3. This configuration was disclosed in the Japanese Examined Patent Publication No. 2-28269 published in June, 1990.

As shows in FIG. 2, the thirteen resistor elements R6, R7, R8, R10, R11, R12, R13, R14, R15, R16, R17, R18, and R19 constituting the R-2R ladder circuit 7 have the same elongated (or, strip-like) plan shape. They are arranged in parallel at regular intervals.

Specifically, in FIG. 2, the resistor element R8 is located in the central position of the ladder circuit region. The resistor element R7 is located on the left-hand side of the resistor element R8 to be apart from a specific interval. Similarly, the resistor elemerts R18, R16 , R14 , R12 , and R10 are successively arranged at the same interval as that of the resistor elements R7 and R8 on the left-hand side of the resistor element R7.

On the other hand, the resistor element R6 is located on the right-hand side of the resistor element R8. Similarly, the resistor elements R19, R17, R15, R13, and R11 are successively arranged at the same interval as that of the resistor elements R6 and R8 on the right-hand side of the resistor element R6.

Thus, the group of the resistor elements R7, R18, R16, R14, R12, and R10 and the group of the resistor elements R6, R19, R17, R15, R13, and R11 are symmetrically laid out with respect to the central resistor element R8.

To realize the function of the ladder circuit 7, the resistor elements R6, R7, R8, R10, R11, R12, R13, R14, R15, R16, R17, R18, and R19 are electrically connected with the use of conductive wiring layers 117a, 117b, 117c, 117d, 117e, 117f, 117g, 117h, 117i, 122a, 122b, 122c, 122d, 122e, 122f, and 122g. The wqiring layers 122a, 122b, 122c, 122d, and 122e are symmetrically laid out with respect to the central resistor element R8.

The resistor element RB is electrically connected to the resistor alement R17 by the wiring layer 117h. Further, the resistor element R8 is electrically connected to the resistor element R19 by the wiring layer 122f and to the constant current sink 4 by the wiring layer 117g.

The resistor element R7 is electrically connected to the resistor element R6 by a wiring layer 117f and to the resistor element R15 by a wiring layer 122g. Further, the resistor element R7 is electrically connected to the resistor elements R8 and R17 by the wiring layer 117h.

The resistor element R6 is electrically connected to the resistor elements R11 and R13 by the wiring layer 117i. Further, the resistor element R6 is electrically connected to the resistor element R15 by the wiring layers 117f and 122g.

The resistor elements R10 and R11 are electrically connected to each other by the wiring layer 122a. The resistor elements R12 and R13 are electrically connected to each other by the wiring layer 122b. The resistor elements R14 and R15 are electrically connected to each other by the wiring layer 122c. The resistor elements R16 and R17 are electrically connected to each other by the wiring layer 122d. The resistor elements R18 and R19 are electrically connected to each other by the wiring layer 122e.

The resistor element R10 is electrically connected to the ground by the wiring layer 117a. The resistor element R12 is electrically connected to the switch S4 by the wiring layer 117b. The resistor element R14 is electrically connected to the switch S3 by the wiring layer 117c. The resistor element R16 is electrically connected to the switch S2 by the wiring layer 117d. The resistor element R18 is electrically connected to the switch S1 by the wiring layer 117e.

The resistor elements R6, R7, R8, R10, R11, R12, R13, R14, R15, R16, R17, R18, and R19 constituting the R-2R ladder circuit 7 have the same structure. Therefore, only the resistor element R8 is explained with reference to FIG. 3.

In FIG. 3, an isolation dielectric layer 113 is selectively formed by a thermal oxidaticnprocess on a main surface of a semiconductor substrate 109 of a first conductivity type. A resistor region 112 with the elongated plan shape as shown in FIG. 2 is selectively formed in the surface area of the substrate 109 by a diffusion or ion-implantation process of suitable dopant atoms of a second conductivity type. A pair of contact regions 111a and 111b are formed in the surface area of the substrate 109 to be contacted with the respective ends of the resistor region 112 by a diffusion or ion-implantation process of suitable dopant atoms of the second conductivity type.

A comparatively thick insulating layer 114 (for example, with a thickness of approximately 1 $\mu$m) is formed to cover the resistor region 112, the pair of contact regions 111a and 111b, and the isolation dielectric layer 113. The layer 114 has a pair of contact holes 115a and 115b at corresponding positions to the pair of contact regions 111a and 111b.

The wiring layer 122f is contacted with and electrically connected to the underlying contact region 111a through the contact hole 115a. The wiring layer 117h is contacted with and electrically connected to the underlying contact region 111b through the contact hole 115b.

The wiring layers 117a, 117b, 117c, 117d, 117e, 117f, 117g, 117h, and 117i are made of aluminum (Al) and located over the isolation dielectric layer 113 and/or the contact regions 111a and 111b. The wiring layers 122a, 122b, 122c, 122d, 122e, 122f, and 122g are made of aluminum and located over the resistor regions 112 for the purpose of a higher scale of integration.

The resistor elements R6, R7, R8, R10, R11, R12, R13, R14, R15, R16, R17, R18, and R19 tend to have some deviation in resistance value from the designed value, which is caused by the thermal distribution unevenness within the ladder circuit region, the distribution unevenness of the diffused or ion-implanted dopant atoms within the ladder circuit region, or the Piezo effect. However, because of the above symmetrical layout of the resistor elements R6, R7, R8, R10, R11, R12, R13, R14, R15, R16, R17, R18, and R19, the resistance deviation is almost all canceled to each other, thereby improving the relative accuracy in resistance value.

With the conventional semiconductor device show in FIGS. 2 and 3, although the comparative thick irisulating layer 114 is formed to cover the resistor elements R6, R7, R8, R10, R11, R12, R13, R14, R15, R16, R17, R18, and R19, a problemn that the resistance of the resistor regions 112 tends to fluctuate dependent upon the electric potential applied to the wiring layers 122a, 122b, 122c, 122d, 122e, 122f, and 122g located over the resistor regions 112 will occur. The reason is as follows.

Generally, when a voltage is applied to the surface of a semiconductor through an oxide layer, the carrier concentration in the semiconductor is changed, resulting in electric resistance change of the semiconductor.

The threshold voltage $V_T$ at which an inversion layer starts to be generated in the surface of the semiconductor is given by the following expression $$V_T \cong \frac{\sqrt{2\varepsilon_s q N_B (2\psi_B)}}{C_i} + 2\psi_B \quad (1)$$

where $\varepsilon_s$ is the dielectric constant of the semiconductor, q is the charge of an electron, $N_B$ is the doping concentration of the semiconductor, $\psi_B$ is the electric potential difference from the center of the bandgap to the Fermi level in the semiconductor, and $C_1$ is the capacitance of the oxide layer.

It is seen from the expression (1) that the threshold voltage $V_T$ becomes higher as the doping concentration of the semiconductor $N_B$ increases. This means that the fluctuation of the carrier concentration (i.e., the resistance) in the surface of the semiconductor is suppressed if the doping concentration of the semiconductor $N_B$ is high.

Further, the capacitance $C_1$ of the oxide layer is given by the following expression (2)

$$C_i = \frac{\varepsilon_{ox}}{t_{ox}} \qquad (2)$$

where $\varepsilon_{ox}$ is the dielectric constant of the oxide layer, and $t_{ox}$ is the thickness thereof.

It is seen from the expressions (2) and (1) that the threshold voltage $V_T$ becomes higher as the thickness $t_{ox}$ of the oxide layer increases. This means that the fluctuation of the carrier concentration (i.e., the resistance) in the surface of the semiconductor is suppressed if the thickness $t_{ox}$ of the oxide layer increases.

With the conventional semiconductor device shown in FIGS. 2 and 3, when the doping concentration of the resistor regions 112 is low, the sheet resistance of the resistor regions 112 is comparatively high. For example, it is 1 to 10 kΩ/□. In this case, as seen from the above expression (1), the resistor regions 112 tend to be affected by the applied voltage, resulting in large resistance fluctuation dependent upon the applied voltage. The voltage dependence of the resistance of the resistor regions 112 is, for example, approximately 0.1%/V.

If the resistor elements having the voltage dependence of approximately 0.1%/V are used for a R-2R ladder circuit in a 9-bit DAC, the output voltage change per bit of this DAC will be 0.2%, because $(\frac{1}{2}^9) \times 100 = 0.2$. This means that the conversion accuracy of this DAC is largely affected by the voltage dependence of the resistance.

To solve the above problem of the resistance deviation due to the applied voltage to the wiring layers, an improvement that a heavily doped region is additionally formed in the overlapped part of a resistor region and a wiring layer was developed. This imuprovement was disclosed in the Japanese Non-Examined Patent Publication No. 58-10851 published in January, 1983.

In this improvement, the heavily doped region is provided in the overlapped part of the resistor region and as a result, the carrier concentration in the surface of the heavily doped region exhibits almost no change even if the applied voltage to the wiring layer varies. Consequently, the resistance deviation of the resistor region can be suppressed.

However, with the improved configuration disclosed in the Japanese Non-Examined Patent Publication No. 58-10851, the following problem will occur.

Specifically, since the heavily doped region serves as a part of the resistor region, it increases the resistance value of the resistor element. The heavily doped region typically has a sheet resistance of several tens Ω/□. Therefore, if the resistance increase due to the addition of the heavily doped region is 20 Ω and the designed or wanted resistance of the resistor element is 10 kΩ, the resistance increase will be 0.2% with respect to the designed resistance value, because $(20/10k) \times 100 = 0.2$. This means that the resistance increase due to the heavily doped region largely affects the conversion accuracy of the DAC.

SUMMARY OF THE INVENTION

Accordingly, an object of the present invention is to provide a semiconductor resistor element that is difficult to be affected by the change of an applied voltage to a wiring conductor.

Another object of the present invention is to provide a semiconductor device that is difficult to be affected by the change of an applied voltage to a wiring conductor.

Still another object of the present invention is to provide a semiconductor device that is able to improve the resistance ratio accuracy of resistor elements.

According to a first aspect of the present invention, a semiconductor resistor element is provided, which includes a semiconductor substructure, and first, second, and third semiconductor resistor regions.

The first resistor region is formed in a surface area of the substructure, and has a first doping concentration.

The second semiconductor resistor region is electrically connected to a first end of the first resistor region. The second resistor region has a second doping concentration higher than the first doping concentration.

The third semiconductor resistor region is electrically connected to a second end of the first resistor region. The second end of the first resistor region is opposite to the first end thereof. The third resistor region has a third doping concentration equal to the second doping concentration.

The second resistor region serves as a first terminal of the semiconductor resistor element and the third resistor region serves as a second terminal thereof.

With the semiconductor resistor element according to the first aspect of the present invention, the second and third semiconductor resistor regions whose doping concentrations are higher than the first semiconductor resistor region are formed to be electrically connected to the opposite first and second ends of the first resistor region. Also, the second resistor region serves as a first terminal of the semiconductor resistor element and the third resistor region serves as a second terminal thereof.

Therefore, if a wiring conductor or conductors are formed over at least one of the second arid third resistor regions through an insulating layer, the resistance of the second and third resistor regions is difficult to be affected by the change of an applied voltage to the wiring conductor or conductors due to their higher doping concentration.

Further, since the wiring conductor or conductors are not located over the first resistor region through the insulating layer, the resistance of the first resistor region is difficult to be affected by the change of the applied voltage.

As a result, the total resistance of the first, second, and third resistor regions (i.e., the resistance of the semiconductor resistor element) is difficult to be affected by the change of the applied voltage to the wiring conductor or conductors.

In a preferred embodiment of the semiconductor resistor element according to the first aspect, the second and third resistor regions are formed in the surface area of the substructure. The second resistor region is contacted with the first end of the first resistor region and the third resistor region is contacted with the second end of the first resistor region.

In another preferred embodiment of the semiconductor resistor element according to the first aspect, the second and third resistor regions are formed on or over an insulator layer formed on the surface area of the substructure. The second resistor region is not contacted with the first end of the first resistor region and is electrically connected to the first resistor region through a first interconnection conductor. The third resistor region is not contacted with the second end of the first resistor region and is electrically connected to the first resistor region through a second interconnection conductor.

Each of the second and third resistor regions is preferably made of a polycrystalline semiconductor doped with an impurity.

Each of the first and second interconnection conductors is preferably made of a metal.

The substructure is preferably made of a semiconductor substrate. However, it may be the combination of a semiconductor layer and a semiconductor (or insulator) substrate for supporting the semiconductor layer.

The second and third resistor regions may be formed in the surface area of the substructure or on an insulator formed on or over the surface area of the substructure. The second and third resistor regions may be made of a same semiconductor material as that of the first resistor region, or of a different semiconductor material or materials from, that of the first resistor region.

The first doping concentration of the first resistor region may be optionally determined as necessary. It is typically that the first doping concentration is in the range of $1 \times 10^{14}$ to $1 \times 10^{16}$ atoms/cm$^3$.

The second and third doping concentrations of the second and third resistor regions also may be optionally determined as necessary if they are higher than the first doping concentration. However, it is preferred that the second and third doping concentrations are in the range of $1 \times 10^{18}$ to $1 \times 10^{20}$ atoms/cm$^3$.

According to a second aspect of the present invention, a semiconductor device is provided, which includes a semiconductor substructure, a first insulator layer formed on the substructure to selectively expose an area of the substructure, and first, second, third, fourth, fifth, and sixth resistor regions.

The first, second and third resistor regions constitute a first resistor element, and the fourth, fifth and sixth resistor regions constitute a second resistor element.

The first resistor region has a first doping concentration. The second resistor region has a second doping concentration higher than the first doping concentration. The third resistor region has a third doping concentration equal to the second doping concentration.

The fourth resistor region has a fourth doping concentration equal to the first doping concentration. The fifth resistor region has a fifth doping concentration equal to the second doping concentration. The sixth resistor region has a sixth doping concentration equal to the second doping concentration.

The first resistor region is formed in the exposed area of the substructure. The second and third resistor regions are electrically connected to respective ends of the first resistor region. The fourth resistor region is formed in the exposed area of the substructure. The fifth and sixth resistor regions are electrically connected to respective ends of the fourth resistor region.

The semiconductor device according to the second aspect further includes a second insulator layer forced to cover the first, second, third, fourth, fifth, and sixth resistor regions, and first and second wiring conductors formed on the second insulator layer. The second insulator layer has first and second contact holes for the first resistor element, and third, and fourth contact holes for the second resistor element.

The first wiring conductor is electrically connected to the second and third resistor regions of the first resistor element through the first and second contact holes of the second insulator layer. The firs: wiring conductor is located to overlap with the second resistor region of the first resistor element and the fifth resistor region of the second resistor element.

The second wiring conductor is electrically connected to the fifth and sixth resistor regions of the second resistor element through the third and fourth contact holes of the second insulator layer. The second wiring conductor is located to overlap with the third resistor region of the first resistor element and the sixth resistor region of the second resistor element.

With the semiconductor device according to the second aspect of the present invention, each of the first and second resistor elements has substantially the same configuration as that of the resistor element according to the first aspect. Therefore, the total resistance of the first, second, and third resistor regions (i.e., the resistance of the first resistor element) and the total resistance of the fourth, fifth, and sixth resistor regions (i.e., the resistance of the second resistor element) are difficult to be affected by the change of the applied voltage to the wiring conductor or conductors.

As a result, the resistance ratio accuracy of the first and second resistor elements are able to be improved.

In a preferred embodiment of the semiconductor device according to the second aspect, the first and second resistor elements are arranged in parallel and apart from each other. Each of the first and second resistor elements has an elongated plan shape.

In another preferred embodiment of the semiconductor device according to the second aspect, the second, third, fifth, and sixth resistor regions are formed in the exposed area of the substructure. The second resistor region is contacted with the first end of the first resistor region. The third resistor region is contacted with the second end of the first resistor region.

In still another preferred embodiment of the semiconductor device according to the second aspect, the second, third, fifth, and sixth resistor regions are formed on the second insulator layer. The second resistor region is not contacted with the first resistor region and is electrically connected to the first resistor region through a first interconnection conductor. The third resistor region is not contacted with the first resistor region and is electrically connected to the first resistor region through a second interconnection conductor. The fifth resistor region is not contacted with the fourth resistor region and is electrically connected to the fourth resistor region through a third interconnection conductor. The sixth resistor region is not contacted with the fourth resistor region and is electrically connected to the fourth resistor region through a fourth interconnection conductor.

Each of the second, third, fifth, and sixth resistor regions is preferably made of a polycrystalline semiconductor doped with an impurity.

Each of the first, second, third, and fourth interconnection conductors is preferably made of a metal.

Also in the semiconductor device according to the second aspect, the substructure is preferably made of a semiconductor substrate. However, it may be the combination of a semiconductor layer and a semiconductor (or insulator) substrate for supporting the semiconductor layer.

The second, third, fifth, and sixth resistor regions may be formed in the surface area of the substructure or on an insulator formed on or over the surface area of the substructure. The second, third, fifth, and sixth resistor regions may be made of a same semiconductor material as that of the first resistor region, or of a different semiconductor material or materials from that of the first resistor region.

Each of the first to sixth doping concentrations may be optionally determined as necessary in the same way as that of the semiconductor resistor element according to the first aspect.

9

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
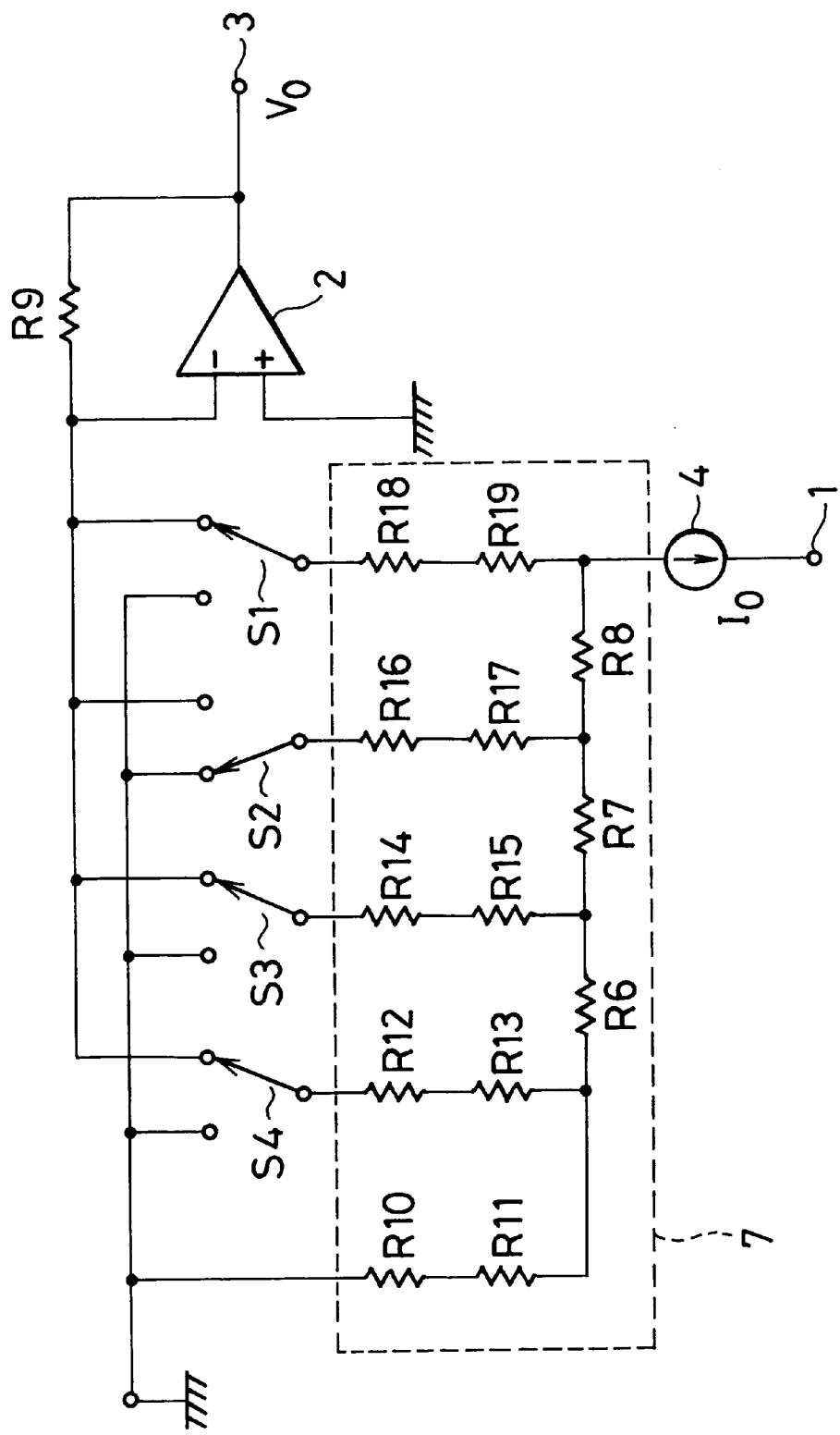
FIG. 1 is a circuit diagram of a conventional DAC including an R-2R ladder circuit.

Preferred embodiments of the present invention will be described below referring to the drawings attached.

FIRST EMBODIMENT

Figure 4:
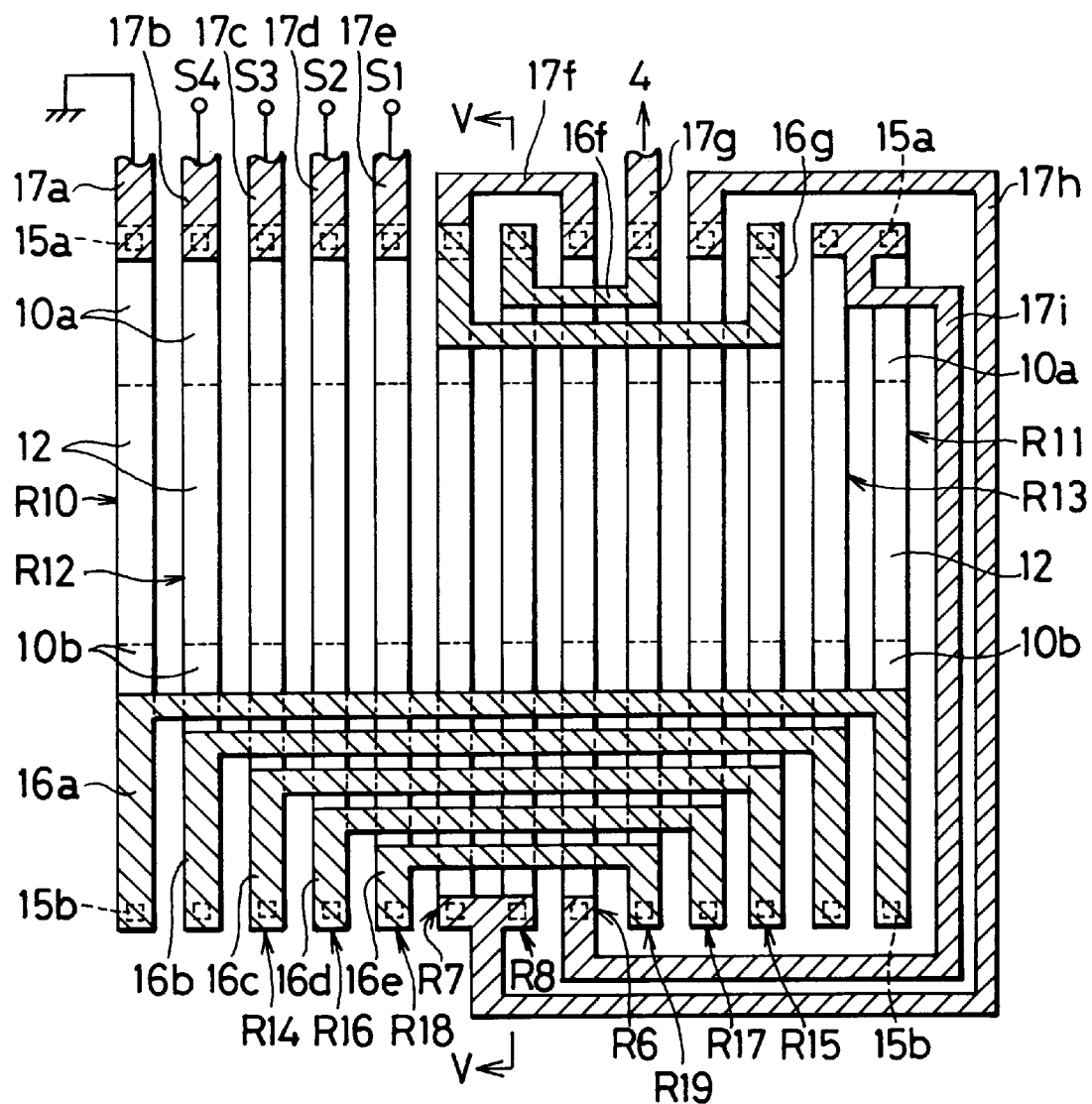
FIG. 4 is a schematic plan view of a semiconductor device according to a first embodiment of the present invention, which realizes the R-2R ladder circuit included in the conventional DAC of FIG. 1.
Figure 5:
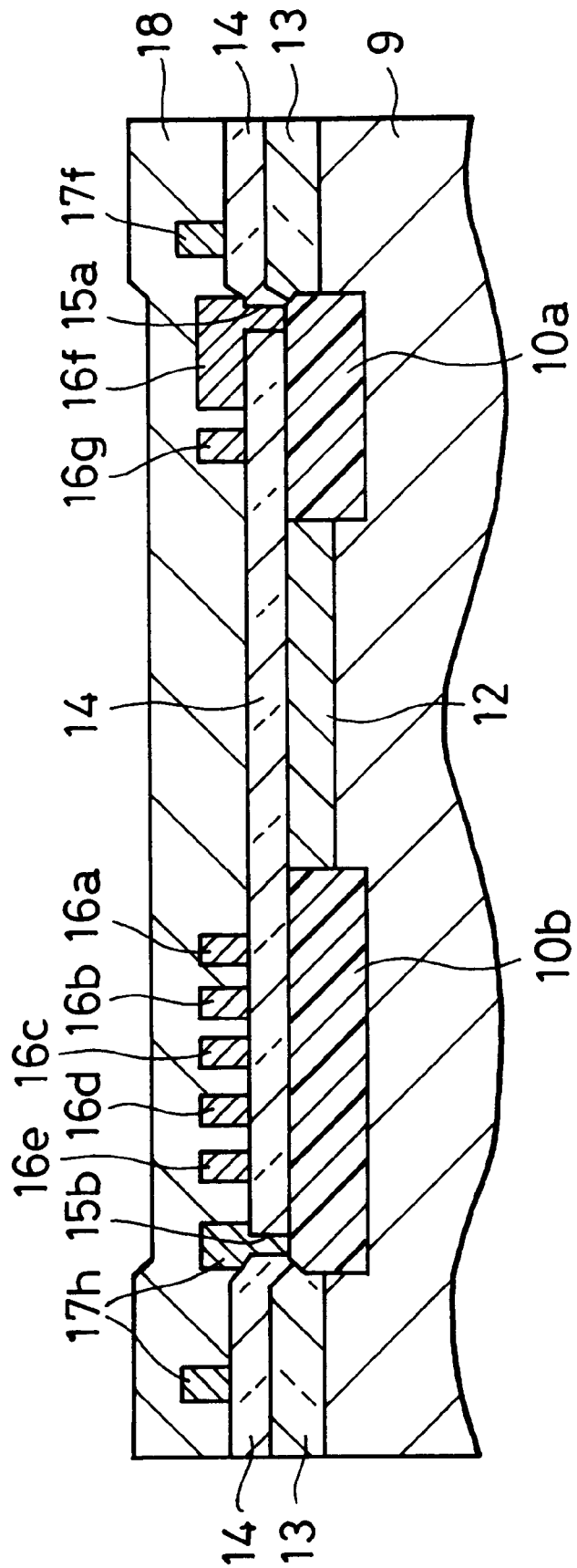
FIG. 5 is a schematic, partial cross-sectional view along the line V—V in FIG. 4.

A semiconductor device according to a first embodiment of the present invention is shown in FIGS. 4 and 5. This semiconductor device realizes the R-2R ladder circuit used in the conventional DAC of FIG. 1 and therefore, the description relating to the ladder circuit is omitted here by adding the same reference numerals as those in FIG. 2 to the corresponding elements in FIG. 4 for the sake of simplification of description.

Figure 2:
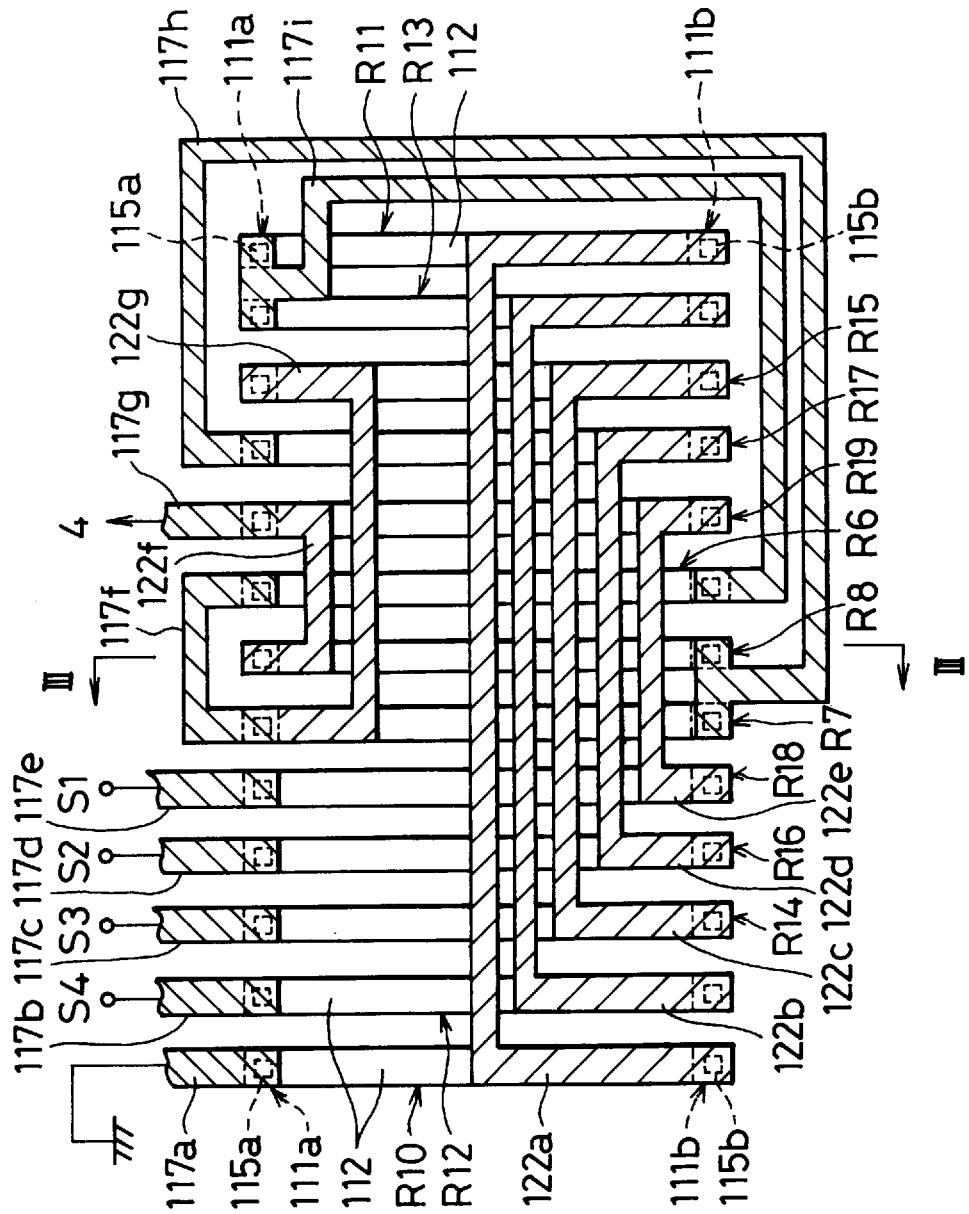
FIG. 2 is a schematic plan view of a semiconductor device realizing the R-2R ladder circuit included in the conventional DAC of FIG. 1, which shows the layout of the resistor elements and their interconnection conductors in the R-2R ladder circuit.
Figure 3:
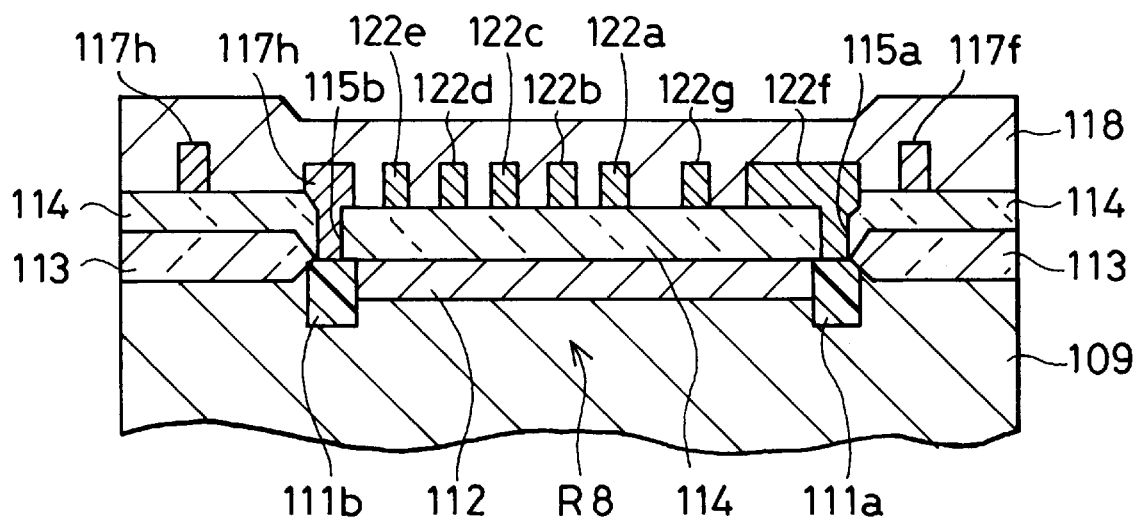
FIG. 3 is a schematic, partial cross-sectional view along the line III—III in FIG. 2.

In FIG. 4, the thirteen resistor elements R6, R7, R8, R10, R11, R12, R13, R14, R15, R16, R17, R18, and R19 constituting the R-2R ladder circuit 7 in FIG. 1 have the same elongated or strip-like plan shape, They are arranged in parallel at regular intervals.

Specifically, in FIG. 4, the resistor element R8 is located in the central position of the ladder circuit region. The resistor element R7 is located on the left-hand side of the resistor element R8 to be apart from a specific interval. Similarly, the resistor elemerts R18, R16, R14, R12, and R10 are successively arranged at the same interval as that of the resistor elements R7 and R8 on the left-hand side of the resistor element R7.

On the other hand, the resistor element R6 is located on the right-hand side of the resistor element R8. Similarly, the resistor elements R19, R17, R15, R13, and R11 are successively arranged at the same interval as that of the resistor elements R6 and R8 on the right-hand side of the resistor element R6.

Thus, the group of the resistor elements R7, R18, R16, R14, R12, and R10 and the group of the resistor elements R6, R19, R17, R15, R13, and R11 are symmetrically laid out with respect to the central resistor element R8.

To realize the function of the ladder circuit 7, the resistor elements R6, R7, R8, R10, R11, R12, R13, R14, R15, R16,

10

R17, R18, and R19 are electrically connected with the use of conductive wiring layers 16a, 16h, 16c, 16d, 16e, 16f, 16g, 17a, 17b, 17c, 17d, 17e, 17f, 17g, 17h, 17i. The wiring layers 16a, 16b, 16c, 16d, and 16e are symmetrically laid out with respect to the central resistor element R8.

The resistor element R8 is electrically connected to the resistor element R17 by the wiring layer 17h. Further, the resistor element R8 is electrically connected to the resistor element R19 by the wiring layer 16f and to the constant current sink 4 by the wiring layer 17g.

The resistor element R7 is electrically connected to the resistor element R6 by a wiring layer 17f and to the resistor element R15 by a wiring layer 16g. Further, the resistor element R7 is electrically connected to the resistor elements R8 and R17 by the wiring layer 17h.

The resistor element R6 is electrically connected to the resistor elements R11 and R13 by the wiring layer 17i. Further, the resistor element R6 is electrically connected to the resistor element R15 by the wiring layers 17f and 16g.

The resistor elements R10 and R11 are electrically connected to each other by the wiring layer 16a. The resistor elements R12 and R13 are electrically connected to each other by the wiring layer 16b. The resistor elements R14 and R15 are electrically connected to each other by the wiring layer 16c. The resistor elements R16 and R17 are electrically connected to each other by the wiring layer 16d. The resistor elements R18 and R19 are electrically connected to each other by the wiring layer 16e.

The resistor element R10 is electrically connected to the ground by the wiring layer 17a. The resistor element R12 is electrically connected to the switch S4 by the wiring layer 17b. The resistor element R14 is electrically connected to the switch S3 by the wiring layer 17c. The resistor element R16 is electrically connected to the switch S2 by the wiring layer 17d. The resistor element R18 is electrically connected to the switch S1 by the wiring layer 17e.

The resistor elements R6, R7, R8, R10, R11, R12, R13, R14, R15, R16, R17, R18, and R19 constituting the R-2R ladder circuit 7 have the same structure. Therefore, only the resistor element R8 is explained with reference to FIG. 5.

In FIG. 5, an isolation dielectric layer 13 is selectively formed by a thermal oxidation process on a main surface of a semiconductor substrate 9 of a first conductivity type.

A first resistor region 12 with a strip-like plan shape as shown in FIG. 4 is selectively formed in the exposed surface area of the substrate 9 by a diffusion or ion-implantation process of suitable dopant atoms of a second conductivity type. The first resistor region 12 has a doping concentration of approximately $1 \times 10^{16}$ atoms/cm$^3$.

Second and third resistor regions 10a and 10b are further formed in the exposed surface area of the substrate 9 by a diffusion or ion-implantation process of suitable dopant atoms of the second conductivity type. The second and third resistor regions 10a and 10b are contacted with the corresponding ends of the first resistor region 12, respectively. Each of the second and third resistor regions 10a and 10b also has a strip-like plan shape.

The second and third resistor regions 10a and 10b has the same doping concentration of approximately $1 \times 10^{18}$ atoms/cm$^3$, which is higher than that of the first resistor region 12.

The doping concentration of the regions 10a and 10b may be the same as that of a source/drain region in a Metal-oxide-Semiconductor (MOS) process or an emitter region in a bipolar process.

The first, second, and third resistor regions 12, 10a and 10b constitute the resistor element R8. The resistance of the resistor element R8 is expressed by the sum or combined resistance of the first, second, and third resistor regions 12, 10a and 10b.

A comparatively thick insulating layer 14 (for example, with a thickness of approximately 1 μm) is formed to cover the first, second, and third resistor regions 12, 10a, and 10b, and the isolation dielectric layer 13 by a Chemical Vapor Deposition (CVD) process or the like. The layer 14 has a pair of contact holes 15a and 15b at positions just over the second and third resistor regions 10a and 10b, respectively. The contact hole 15a is located near the outer end of the second resistor region 10a. The contact hole 15b is located near the outer end of the third resistor region 10b.

The wiring layer 16f is contacted with and electrically connected to the underlying second resistor region 10a through the Contact hole 15a. The wiring layer 17h is contacted with and electrically connected to the underlying third resistor region 10b through the contact hole 15b. Thus, the second and third resistor regions 10a and 10b serve as a pair of terminals of the resistor element R8.

Here, each of the wiring layers 17a, 17b, 17c, 17d, 17e, 17f, 17g, 17h, 17i, 16a, 16b, 16c, 16d, 16e, 16f, and 16g is made of a patterned aluminum (Al) layer, which is fabricated by forming nd patterning processes of an aluminum layer.

As clearly seen from FIG. 4, the wiring layers 17a, 17b, 17c, 17d, 17e, 17f, 17g, 17h, and 17i are formed to extend over the isolation dielectric layer 13. The wiring layers 16a, 16b, 16c, 16d, 16e, 16f, and 16g are formed to extend over the second or third resistor region 10a or 10b. In other words, the wiring layers 16a, 16b, 16c, 16d, 16e, 16f, and 16g are arranged to overlap with the second or third resistor regions 10a and 10b having the higher doping concentrations than that of the first resistor region 12 within the ladder circuit region. No wiring conductors overlap with the first resistor region 12.

The wiring layers 17a, 17b, 17c, 17d, 17e, 17f, 17g, 17h, 17i, 16a, 16b, 16c, 16d, 16e, 16f, and 16g are covered with an interlayer insulating layer 18, which is formed by a CVD process or the like.

With the semiconductor device according to the first embodiment of the present invention, the second and third semiconductor resistor regions 10a and 10b whose doping concentrations are higher than the first semiconductor resistor region 12 of each of the resistor elements R6, R7, R8, R10, R11, R12, R13, R14, R15, R16, R17, R18, and R19 are formed to be electrically connected to the opposite ends of the first resistor region 12.

Also, since the wiring layers 17a, 17b, 17c, 17d, 17e, 17f, 17g, 17h, 17i, 16a, 16b, 16c, 16d, 16e, 16f, and 16g are formed on the insulating layer 14 to overlap with the second and third resistor regions 10a and 10b, the resistance of the second and third resistor regions 10a and 10b is difficult to be affected by the change of an applied voltage to the wiring layers 17a, 17b, 17c, 17d, 17e, 17f, 17g, 17h, 17i, 16a, 16b, 16c, 16d, 16e, 16f, and 16g due to their higher doping concentration.

Further, the wiring layers 17a, 17b, 17c, 17d, 17e, 17f, 17g, 17h, 17i, 16a, 16b, 16c, 16d, 16e, 16f, and 16g are not located over the first resistor regiorn 12 and therefore, the resistance of the first resistor region 12 is difficult to be affected by the change of the applied voltage.

As a result, the total resistance of the first, second, and third resistor regions 12, 10a, and 10b, i.e., the resistance of each semiconductor resistor element, is difficult to be affected by the change of the applied voltage to the wiring layers 17a, 17b, 17c, 17d, 17e, 17f, 17g, 17h, 17i, 16a, 16b, 16c, 16d, 16e, 16f, and 16g.

This mears that the resistance deviation of each of the resistor elements R6, R7, R8, R10, R11, R12, R13, R14, R15, R16, R17, R18, and R19, which is caused by the thermal distribution unevenness and/or the distribution unevenness of the dopant atoms within the ladder circuit region, or the Piezo effect, is able to be suppressed, thereby improving the relative resistance accuracy in the R-2R ladder circuit 7.

Each of the resistor elements R6, R7, R8, R10, R11, R12, R13, R14, R15, R16, R17, R18, and R19 has the second and third resistor regions 10a and 10b and therefore, the wanted resistance ratios (for example, 2:1) are able to be realized without any problem even if the second and third resistor regions 10a and 10b are added.

Additionally, since the wiring layers 16a, 16b, 16c, 16d, 16e, 16f, and 16g can be located over the second and third resistor regions, there is an additional advantage that the freedom of circuit layout is improved.

It is needless to say that the plan shape and the layout of the resistor elements R6, R7, R8, R10, R11, R12, R13, R14, R15, R16 R17, R18, and R19 can be changed to any other ones as necessary.

SECOND EMBODIMENT

Figure 6:
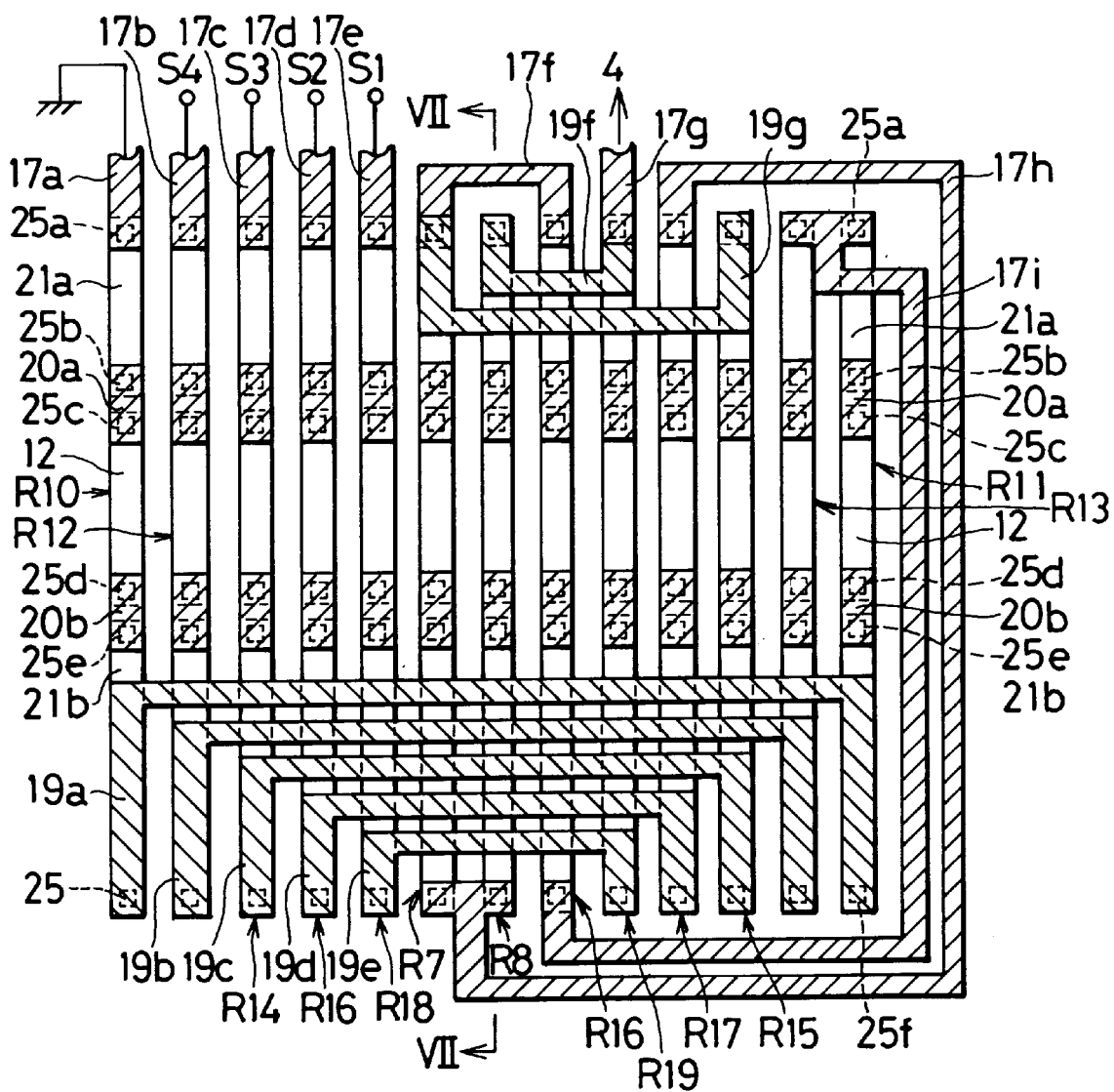
FIG. 6 is a schematic plan view of a semiconductor device according to a second embodiment of the present invention, which realizes the R-2R ladder circuit included in the conventional DAC of FIG. 1.
Figure 7:
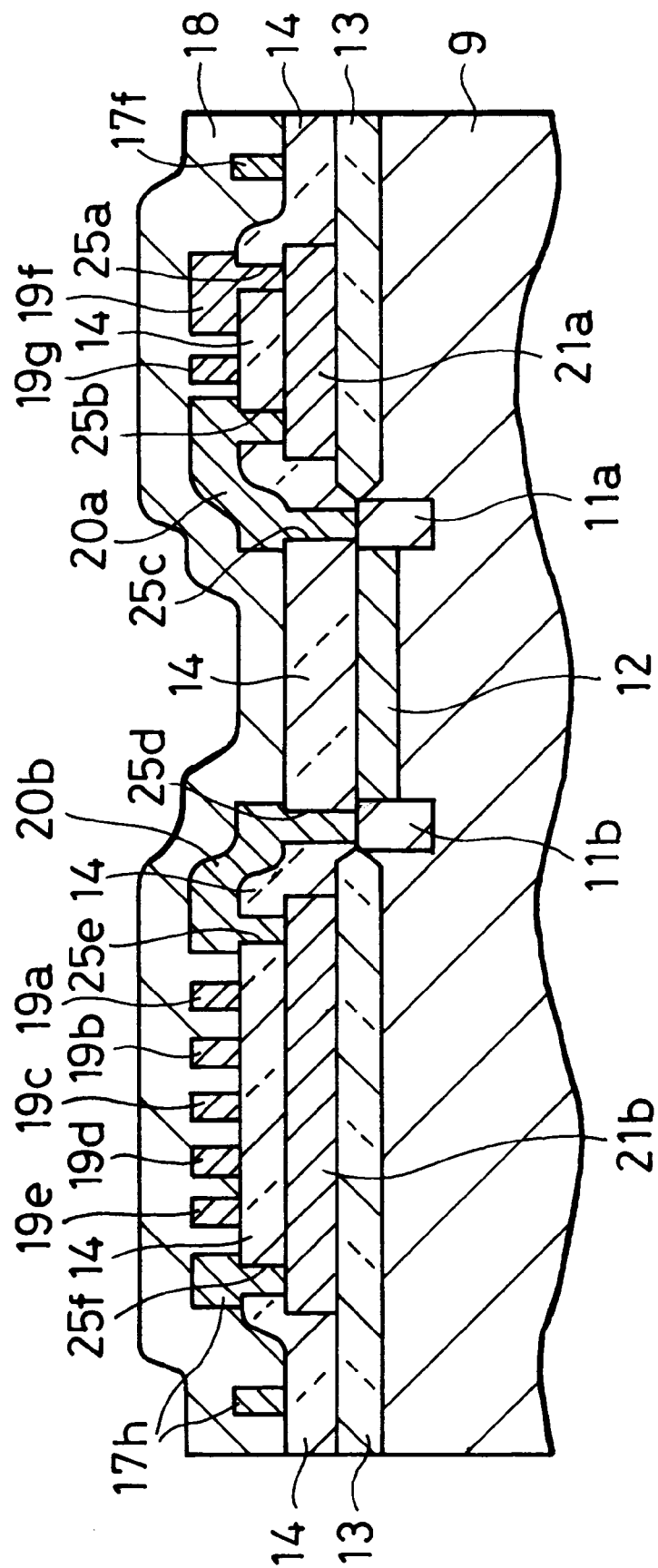
FIG. 7 is a schematic, partial cross-sectional view along the line VII—VII in FIG. 6.

A semiconductor device according to a second embodiment of the present invention is shown in FIGS. 6 and 7. This semiconductor device also realizes the R-2R ladder circuit 7 used in the conventional DAC of FIG. 1.

In FIG. 6, the thirteen resistor elements R6, R7, R8, R10, R11, R12, R13, R14, R15, R16, R17, R18, and R19 constituting the R-2R ladder circuit 7 have the same elongated or strip-like plan shape. They are arranged with substantially the same layout as that of the first embodiment.

To realize the function of the ladder circuit 7, the resistor elements R6, R7, R8, R10, R11, R12, R13, R14, R15, R16, R17, R18, and R19 are electrically connected with the use of conductive wiring layers 19a, 19b, 19c, 19d, 19e, 19f, 19g, 17a, 17b, 17c, 17d, 17e, 17f, 17g, 17h, 17i. The wiring layers 19a, 19b, 19c, 19d, and 19e are symmetrically laid out with respect to the central resistor element R8.

The resistor element R8 is electrically connected to the resistor element R17 by the wiring layer 17h. Further, the resistor element R8 is electrically connected to the resistor element R19 by the wiring layer 19f and to the constant current sink 4 by the wiring layer 17g.

The resistor element R7 is electrically connected to the resistor element R6 by a wiring layer 17f and to the resistor element R15 by a wiring layer 19g. Further, the resistor element R7 is electrically connected to the resistor elements R8 and R17 by the wiring layer 17h.

The resistor element R6 is electrically connected to the resistor elements R11 and R13 by the wiring layer 17i. Further, the resistor element R6 is electrically connected to the resistor element R15 by the wiring layers 17f and 19g.

The resistor elements R10 and R11 are electrically connected to each other by the wiring layer 19a. The resistor elements R12 and R13 are electrically connected to each other by the wiring layer 19b. The resistor elements R14 and R15 are electrically connected to each other by the wiring layer 19c. The resistor elements R16 and R17 are electrically connected to each other by the wiring layer 19d. The resistor elements R18 and R19 are electrically connected to each other by the wiring layer 19e.

The resistor element R10 is electrically connected to the ground by the wiring layer 17a. The resistor element R12 is electrically connected to the switch S4 by the wiring layer 17b. The resistor element R14 is electrically connected to the switch S3 by the wiring layer 17c. The resistor element R16 is electrically connected to the switch 52 by the wiring layer 17d. The resistor element R18 is electrically connected to the switch S1 by the wiring layer 17e.

The resistor elements R6, R7, R8, R10, R11, R12, R13, R14, R15, R16, R17, R18, and R19 have the same structure. Therefore, only the resistor element R8 is explained here with reference to FIG. 7.

In FIG. 7, an isolation dielectric layer 13 is selectively formed by a thermal oxidation process on a main surface of a semiconductor substrate 9 of a first conductivity type. A first resistor region 12 with a strip-like plan shape as shown in FIG. 6 is selectively formed in the exposed surface area of the substrate 9 by a diffusion or ion-implantation process of suitable dopant atoms of a second conductivity type. The first resistor region 12 has a doping concentration of approximately $1 \times 10^{16}$ atoms/cm$^3$. This structure is the same as that of the first embodiment.

A pair of contacts regions 11a and 11b are further formed in the exposed surface area of the substrate 9 by a diffusion or ion-implantation process of suitable dopant atoms of the second conductivity type. The pair of contact regions 11a and 11b are contacted with the corresponding ends of the first resistor region 12, respectively. Each of the pair of contact regions 11a and 11b also has a square plan shape.

The pair of contact regions 11a and 11b have the same doping concentration of approximately $1 \times 10^{18}$ atoms/cm$^3$, which is higher than that of the first resistor region 12.

The doping concentration of the regions 11a and 11b may be the same as that of a source/drain region in a Metal-oxide-Semiconductor (MOS) process or an emitter region in a bipolar process.

Unlike the first embodiment, second and third resistor regions 21a and 21b each having an elongated or strip-like plan shape are formed on the isolation dielectric layer 13 at the respective sides of the first resistor region 12. The second and third resistor regions 21a and 21b are apart from the first resistor region. 12.

It is sufficient that each of the second and third resistor regions 21a and 21b has a doping concentration higher than that of the first resistor region 12.

A comparatively thick insulating layer 14 (for example, with a thickness of approximately 1 $\mu$m) is formed by a CVD process or the like to cover the first resistor regions 12, the second and third resistor regions 21a and 21b, the pair of contact regions 11a and 11b, and the exposed isolation dielectric layer 13. The layer 14 has contact holes 25a, 25b, 25c, 25d, 25e, and 25f.

The contact holes 25a and 25b are located over the second resistor region 21a. The contact holes 25c and 25d are located at positions just over the pair of contact regions 11a and 11b, respectively, The contact holes 25e and 25f are located over the third resistor region 21b.

The wiring layer 19f is contacted with and electrically connected to the underlying second resistor region 21a through the contact hole 25a. The wiring layer 17h is contacted with and electrically connected to the underlying third resistor region 21b through the contact hole 25f. Thus, the second and third resistor regions 21a and 21b serve as a pair of terminals of the resistor element R8.

To electrically connect the second and third resistor regions 21a and 21b to the first resistor region 12, respectively, interconnection layers 20a and 20b are pro-vided in the second embodiment. The interconnection layer 20a is contacted with and electrically connected to the underlying second resistor region 21a through the contact hole 25b and the underlying first resistor region 12 through the contact hole 25c. Similarly, the interconnection layer 20b is contacted with and electrically connected to the underlying third resistor region 21b through the contact hole 25e and the underlying first resistor region 12 through the contact hole 25d.

The interconnection layer 20a is contacted with the second resistor region 21a at its inner end, and the wiring layer 17h is contacted with the region 21a at its outer end. The interconnection layer 20b is contacted with the third resistor region 21b at its inner end, and the wiring layer 19f is contacted with the region 21b at its outer end. Thus, similar to the first embodiment, the second and third resistor regions 21a and 21b serve as a pair of terminals of the resistor element R8.

The first, second, and third resistor regions 12, 21a and 21b constitute the resistor element R8. The resistance of the resistor element R8 is expressed by the sum or combined resistance of the first, second, and third resistor regions 12, 21a and 21b, and the interconnection layers 20a and 20b.

As clearly seen from FIG. 6, the wiring layers 17a, 17b, 17c, 17d, 17e, 17f, 17g, 17h, and 17i are formed to extend over the isolation dielectric layer 13. The wiring layers 19a, 19b, 19c, 19d, 19e, 19f, and 19g are formed to extend over the second or third resistor region 21a or 21b. In other words, the wiring layers 19a, 19b, 19c, 19d, 19e, 19f, and 19g are arranged to overlap with the second or third resistor regions 21a and 21b having the higher doping concentrations than that of the first resistor region 12 within the ladder circuit region. No wiring conductors overlap with the first resistor region 12.

Here, each of the wiring layers 17a, 17b, 17c, 17d, 17e, 17f, 17g, 17h, 17i, 19a, 19b, 19c, 19d, 19e, 19f, and 19g is made of a patterned aluminum (Al) layer, which is fabricated by forming and patterning processes of an aluminum layer. The interconnection layers 20a and 20b are made of the same aluminum layer as that of the wiring layers 17a, 17b, 17c, 17d, 17e, 17f, 17g, 17h, 17i, 19a, 19b, 19c, 19d, 19e, 19f, and 19g in the same process step.

Each of the second and third resistor regions 21a and 21b is made of a patterned polysilicon layer doped with an impurity, which is fabricated by forming and patterning processes of a polysilicon layer.

The wiring layers 17a, 17b, 17c, 17d, 17e, 17f, 17g, 17h, 17i, 19a, 19b, 19c, 19d, 19e, 19f, and 19g are covered with an interlayer insulating layer 18, which is formed by a CVD process or the like.

With the semiconductor device according to the second embodiment of the present invention, the second and third semiconductor resistor regions 21a and 21b whose doping concentrations are higher than the first semiconductor resistor region 12 of each of the resistor elements R6, R7, R8, R10, R11, R12, R13, R14, R15, R16, R17, R18, and R19 are formed to be electrically connected to the opposite ends of the first resistor regivn 12.

Also, since the wiring layers 17a, 17b, 17c, 17d, 17e, 17f, 17g, 17h, 17i, 19a, 19b, 19c, 19d, 19e, 19f, and 19g are formed on the insulating layer 14 to overlap with the second and third resistor regions 21a and 21b, the resistance of the second and third resistor regions 21a and 21b is difficult to be affected by the change of an applied voltage to the wiring layers 17a, 17b, 17c, 17d, 17e, 17f, 17g, 17h, 17i, 19a, 19b, 19c, 19d, 19e, 19f, and 19g due to their higher doping concentration.

Further, the wiring layers 17a, 17b, 17c, 17d, 17e, 17f, 17g, 17h, 17i, 19a, 19b, 19c, 19d, 19e, 19f, and 19g are not located over the firsL resistor region 12 and therefore, the resistance of the first resistor region 12 is difficult to be affected by the change of the applied voltage.

As a result, the total resistance of the first, second, and third resistor regions 12, 21a, and 21b, i.e., the resistance of each semiconductor resistor element, is difficult to be affected by the change of the applied voltage to the wiring layers 17a, 17b, 17c, 17d, 17e, 17f, 17g, 17h, 17i, 19a, 19b, 19c, 19d, 19e, 19f, and 19g. This means that the resistance deviation of each of the resistor elements R6, R7, R8, R10, R11, R12, R13, R14, R15, R16, R17, R18, and R19 is able to be suppressed, thereby improving the relative resistance accuracy in the R-2R ladder circuit 7.

Since the wiring layers 19a, 19b, 19c, 19d, 19e, 19f, and 19g can be located over the second and third resistor regions, there is an additional advantage that the freedom of circuit layout is improved.

In the second embodiment, there is another additional advantage that no parasitic diode will occur between the substrate 9 and the second and third resistor regions 21a and 21b.

In the above first and second embodiments, each of the second and third resistor regions is made of a diffusion or ion-implanted region and a patterned, doped polysilicon layer. However, any other conductive material may be used for the second and third resistor regions.

Further, although the R-2R ladder circuit is shown in the above embodiments, the present invention can be applied to any other circuit including at least one resistor element.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A semiconductor device comprising:
    (a) a semiconductor substructure;
    (b) a first insulator layer formed on said substructure to selectively expose an area of said substructure;
    (c) at least one resistor element, each said resistor element comprising first, second, and third resistor regions;
        said first resistor region being formed in the exposed area of said substructure;
        said first resistor region having a first doping concentration, said second resistor region having a second doping concentration higher than said first doping concentration, said third resistor region having a third doping concentration equal to said second doping concentration;
        said second and third resistor regions being spaced apart from and electrically connected to respective ends of said first resistor region;
    (d) a second insulator layer formed over said first, second and third resistor regions;
        said second insulator layer having first and second contact holes for said resistor element;
    (e) a first wiring conductor formed on said second insulator layer;
        said first wiring conductor being contacted with and electrically connected to said second resistor region of said resistor element through said first contact hole of said second insulator layer;
        said first wiring conductor being formed not to overlap with said first resistor region of said resistor element; and
    (f) a second wiring conductor formed on said second insulator layer;
        said second wiring conductor being contacted with and electrically connected to said third resistor region of said resistor element through said second contact hole of said second insulator layer;
        said second wiring conductor being formed not to overlap with said first resistor region of said resistor element;
        wherein said second and third resistor regions are formed under said second insulator layer;
        and wherein said second resistor region is not in direct contacte with said first resistor region and is electrically connected to said first resistor region through a first interconnection conductor;
        and wherein said third resistor region is not in direct contact with said first resistor region and is electrically connected to said first resistor region through a second interconnection conductor.

2. A device as claimed in claim 1, wherein each said resistor element is arranged in parallel and apart from each other;
    and wherein each said resistor element has an elongated plan shape.

3. A device as claimed in claim 1, wherein each of said second and third resistor regions is made of a polycrystalline semiconductor doped with an impurity.

4. A device as claimed in claim 1, wherein each of said first and second interconnection conductors is made of a metal.

5. A semiconductor resistor element comprising:
    (a) a semiconductor substructure;
    (b) at least one resistor element, each said element comprising:
        (i) a first semiconductor resistor region formed in a surface area of said substructure;
            said first resistor region having a first doping concentration;
        (ii) a second semiconductor resistor region electrically connected to a first end of said first resistor region;
            said second resistor region having a second doping concentration higher than said first doping concentration;
        (iii) a third semiconductor resistor region electrically connected to a second end of said first resistor region;
            said third resistor region having a third doping concentration equal to said second doping concentration;
            wherein a part of said second resistor region serving as a first terminal of said semiconductor resistor element and a part of said third resistor region serving as a second terminal thereof;
    (c) an insulating layer formed over said first, second, and third resistor regions;
        said insulating layer having first and second contact holes located over said second and third resistor regions, respectively;
    (d) a first wiring conductor formed on said insulating layer;
        said first wiring conductor being contacted with and electrically connected to said part of said second resistor region through said first contact hole of said insulating layer;
        said first wiring conductor being formed not to overlap with said first resistor region; and (e) a second wiring conductor formed on said insulating layer;
  said second wiring conductor being contacted with and electrically connected to said part of said third resistor region through said second contact hole of said insulating layer;
  said second wiring conductor being formed not to overlap with said first resistor region;
  wherein said second and third resistor regions are formed on or over an insulator layer formed on the surface area of said substructure;
    and wherein said second resistor region is not in direct contact with the first end of said first resistor region and is electrically connected to said first resistor region through a first interconnection conductor;
    and wherein said third resistor region is not in direct contact with the second end of said first resistor region and is electrically connected to the first resistor region through a second interconnection conductor.

6. A resistor element as claimed in claim 1,
  wherein the resistance of said resistor element is expressed by the sum resistance of said first, second, and third resistor regions, and said first and second interconnection conductors.

7. A resistor element as claimed in claim 6, wherein each of said second and third resistor regions is made of a polycrystalline semiconductor doped with an impurity.

8. A resistor element as claimed in claim 6, wherein each of said first and second interconnection conductors is made of a metal.

* * * * *

UNITED STATES PATENT AND TRADEMARK OFFICE
CERTIFICATE OF CORRECTION

PATENT NO. : 6,046,491
DATED : April 4, 2000
INVENTOR(S) : Akio Tamagawa

Page 1 of 1

It is certified that error appears in the above-identified patent and that said Letters Patent is hereby corrected as shown below:

Column 16,
Line 13, change "contacte" to -- contact -- and after "with" add -- the first end of --.

Signed and Sealed this

Fourteenth Day of May, 2002

Attest:

JAMES E. ROGAN
Attesting Officer    Director of the United States Patent and Trademark Office